(12) United States Patent
Juntunen et al.

(10) Patent No.: US 10,367,498 B2
(45) Date of Patent: Jul. 30, 2019

(54) THERMALLY CONTROLLED ELECTRONIC DEVICE

(71) Applicant: LAPPEENRANNAN TEKNILLINEN YLIOPISTO, Lappeenranta (FI)

(72) Inventors: Raimo Juntunen, Lappeenranta (FI); Tatu Musikka, Lappeenranta (FI); Andrey Mityakov, Lappeenranta (FI); Juha Pyrhonen, Lappeenranta (FI); Olli Pyrhonen, Lappeenranta (FI); Sergey Z. Sapozhnikov, Lappeenranta (FI); Vladimir Y. Mityakov, Lappeenranta (FI)

(73) Assignee: LAPPEENRANNAN-LAHDEN TEKNILLINEN YLIOPISTO LUT, Lappeenranta (FI)

( * ) Notice: Subject to any disclaimer, the term of this patent is extended or adjusted under 35 U.S.C. 154(b) by 8 days.

(21) Appl. No.: 15/528,854

(22) PCT Filed: Oct. 7, 2015

(86) PCT No.: PCT/FI2015/050670
§ 371 (c)(1),
(2) Date: May 23, 2017

(87) PCT Pub. No.: WO2016/083660
PCT Pub. Date: Jun. 2, 2016

(65) Prior Publication Data
US 2017/0346481 A1    Nov. 30, 2017

(30) Foreign Application Priority Data
Nov. 27, 2014 (FI) .................................. 20146041

(51) Int. Cl.
*H03K 17/08* (2006.01)
*H03K 17/10* (2006.01)
(Continued)

(52) U.S. Cl.
CPC ........... *H03K 17/145* (2013.01); *H03K 17/08* (2013.01); *H03K 17/10* (2013.01); *H03K 17/12* (2013.01);
(Continued)

(58) Field of Classification Search
CPC .. H03K 17/00; H03K 17/145; H03K 2017/00; H03K 2017/0806; H03K 5/00;
(Continued)

(56) References Cited

U.S. PATENT DOCUMENTS 6,203,191 B1 * 3/2001 Mongan .................. G01K 7/42
374/20
2002/0118502 A1   8/2002 Yabe et al.
(Continued)

FOREIGN PATENT DOCUMENTS

WO    2005/015741 A2    2/2005

OTHER PUBLICATIONS

Barnes A: "Heat Flux Sensors. Part 1: Theory", Sensors, North American Technology, Peterborough, NH, US, No. Part I, Jan. 1, 1999 (Jan. 1, 1999), pp. 1-06, XP002907296, ISSN: 0746-9462.
(Continued)

*Primary Examiner* — Lincoln D Donovan
*Assistant Examiner* — Dave Mattison
(74) *Attorney, Agent, or Firm* — Young & Thompson

(57) ABSTRACT

An electronic device includes at least one electronic component, a gradient heat-flux sensor GHFS based on thermoelectric anisotropy and conducting heat generated by the electronic component, and a controller adapted to manage electrical current of the electronic component at least partly on the basis of an electrical control signal generated by the gradient heat-flux sensor and proportional to a heat-flux through the gradient heat-flux sensor. Therefore, the electrical current and thereby also the heat generation of the
(Continued)

electronic component are managed directly on the basis of the heat-flux generated by the electronic component. Thus, the electrical current can be managed without a need for voltage and current measurements which may be challenging to be carried out with a sufficient bandwidth especially when the switching frequency of the electronic component is on a range from hundreds of kHz to few MHz.

13 Claims, 4 Drawing Sheets

(51) Int. Cl.
  *H03K 17/12* (2006.01)
  *H03K 17/14* (2006.01)
(52) U.S. Cl.
  CPC ..... *H03K 17/14* (2013.01); *H03K 2017/0806* (2013.01)
(58) Field of Classification Search
  CPC ........ H03K 5/153; H03K 3/00; H03K 3/2893; H03K 17/14; H03K 17/10; H03K 17/12; G05F 3/00; G05F 3/245; H03F 2200/00; H03F 2200/447
  USPC ........................................................ 327/83
  See application file for complete search history.

(56) References Cited

U.S. PATENT DOCUMENTS

| | | |
|---|---|---|
| 2003/0107093 A1 | 6/2003 | Male |
| 2003/0179033 A1 | 9/2003 | Bienvenu et al. |
| 2004/0178759 A1 | 9/2004 | Nakamura et al. |
| 2008/0150609 A1* | 6/2008 | Durbaum ........... H03K 17/0822 327/513 |
| 2008/0168775 A1 | 7/2008 | Windheim et al. |
| 2011/0051302 A1 | 3/2011 | Dibra |
| 2014/0233186 A1 | 8/2014 | Savelli et al. |

OTHER PUBLICATIONS

Barnes A: "Heat Flux Sensors. Part 2: Applications", Sensors, North American Technology, Peterborough, NH, US, No. Part II, Feb. 1, 1999 (Feb. 1, 1999), pp. 1-06, XP002907297, ISSN: 0746-9462.
Hanne K Jussila et al: "Local Heat Flux Measurement in a Permanent Magnet Motor at No Load", IEEE Transactions on Industrial Electronics, IEEE Service Center, Piscataway, NJ, USA, vol. 60, No. 11, Nov. 1, 2013 (Nov. 1, 2013), pp. 4852-4860, XP011514251, ISSN: 0278-0046, DOI: 10.1109/TIE.2012.2222853.
Dennis, JH. Anisotropy of thermoelectric power in bismuth telluride. Massachusetts Institute of Technology, Research laboratory of Electronics Technical Report 377. Jan. 15, 1961.
FI Search Report, dated Mar. 15, 2016, from corresponding FI application.
International Search Report, dated Jan. 7, 2016, from corresponding PCT application.

* cited by examiner

THERMALLY CONTROLLED ELECTRONIC DEVICE

TECHNICAL FIELD

The disclosure relates generally to thermal management of electronic devices. More particularly, the disclosure relates to a method for managing electrical current in an electronic device. Furthermore, the disclosure relates to an electronic device that can be, for example but not necessarily, a power electronic device such as e.g. a frequency converter.

BACKGROUND

Various electronic devices such as for example frequency converters, rectifiers, and network inverters comprise electronic components for modifying electrical currents and voltages. An electronic component can be for example a controllable power electronic switch such as for example a bipolar junction transistor "BJT", an insulated gate bipolar transistor "IGBT", a thyristor, a gate-turn-off thyristor "GTO", a metal-oxide-semiconductor field-effect transistor "MOSFET", an Integrated Gate-Commutated Thyristor "IGCT", or an Injection-Enhanced Gate Transistor "IEGT". It is also possible that a power electronic switch is a diode in which case the switching operation depends merely on the voltage between the anode and cathode of the diode. When an electronic component conducts electrical current, heat is produced by the internal resistance of the electronic component due to the Joule effect. In electronic components which are used as switches, the momentary heating rate can be especially high during transitions between conductive and non-conductive states. For example, in a transition from the conductive state to the non-conductive state, the internal resistance may have become quite high while the current has not yet decreased. Thus, the heating rate is partly proportional, linearly or non-linearly, to the switching frequency. In electronic components such as e.g. processors, the heating rate is linearly or non-linearly proportional to the clock frequency and the voltage level being used. Increasing the clock frequency means that the internal capacitances of the processor have to be charged and discharged at a higher rate and thus electrical currents which produce heat in the internal resistances of the processer are increased too. Furthermore, increasing the clock frequency or the switching frequency increases the internal effective resistances, and thereby also the heating rate, due to the skin effect.

If the heating rate exceeds the capacity of the available cooling, there is a risk of temperature rise affecting changes in electrical behavior, such that thermal damage could occur in the electronic component under consideration. Therefore, it is important to manage the electrical current of the electronic component so that the heating rate does not exceed the capacity of the cooling. The management of the electrical current may comprise for example short-circuit "SC" protection, control of high frequency components of the electrical current by limiting the switching frequency so as to limit switching losses, management of thermal cycling of an electronic component, reducing the clock frequency of a processor or the like so as to limit electrical currents, and/or balancing of electrical currents of parallel connected electronic components.

The above-mentioned management of the electrical current needs measured information which is directly or indirectly indicative of the heating rate in the electronic component. One conventional technique for measuring the heating rate includes integration of the product of instantaneous values of measured voltage and electrical current. Another conventional technique for measuring the heating rate includes measuring surface temperature from one or more measuring points on the surface of the electronic components. These techniques are, however, not free from challenges. The technique based on the product of the instantaneous values of the voltage and the electrical current requires highly accurate high bandwidth voltage and current sensors where a phase shift between indicated and real voltages and a phase shift between indicated and real electrical currents are sufficiently close to each other in order that the product of the voltage and the electrical current would represent the instantaneous power at a sufficient accuracy. The voltage and current measurements may be challenging to be carried out with a sufficient accuracy especially when the switching frequency of the electronic component is on the range from hundreds of kHz to few MHz. Challenges related to the technique based on the measured surface temperatures are that the junction temperature of the electronic component can be at least occasionally significantly higher than the surface temperatures and that the measured surface temperatures follow the junction temperature with a delay. Therefore, e.g. short-circuit protection based on the measured surface temperatures can be too slow for being able to protect the electronic component. A further challenge for both of the above-mentioned techniques is that those cannot observe the temperatures of individual semiconductor chips in a case where an electronic component is a module type component that contains multiple chips connected in parallel and/or in series. Due to different thermal impedances for different chips and/or due to differences in parasitic inductances and/or resistances concerning different chips, the heat generation and temperatures are generally not the same for every chip.

SUMMARY

The following presents a simplified summary in order to provide a basic under-standing of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the invention, there is provided a new electronic device that can be, for example but not necessarily, a power electronic device such as e.g. a frequency converter, a rectifier, or a network inverter. An electronic device according to the invention comprises:

at least one electronic component, a heat-sink element, a gradient heat-flux sensor "GHFS" based on thermoelectric anisotropy and adapted to conduct heat generated by the electronic component and to generate an electrical control signal proportional to a heat-flux through the gradient heat-flux sensor, the gradient heat-flux sensor constituting at least a part of a heat conduction path from a heat generating portion of the electronic component to the heat-sink element, and a controller responsive to the electrical control signal and adapted to manage electrical current of the electronic component at least partly on the basis of the electrical control signal, wherein the gradient heat-flux sensor comprises at least two sensor elements placed side by side so as to achieve a situation in which disturbance voltages induced by a changing magnetic flux to the sensor elements are substantially same and electrically connected in series so that the disturbance voltages induced by the changing magnetic flux to the sensor elements are adapted to cancel each other at least partly.

The small response time of the gradient heat-flux sensor is utilized in the management of the electrical current. For example, for gradient heat-flux sensors based on anisotropic thermo-elements "AT", the response time τ can be on the range from 1 ns . . . 10 ns. Thus, the response time τ is sufficiently small for achieving a sufficiently fast management of the electrical current. Furthermore, the thick-ness of a gradient heat-flux sensor in the direction of the heat-flux can be small, e.g. about 0.1 mm. Thus, the gradient heat-flux sensor does not represent a significant heat storage capacity which would disturb and slow down the heat-flux measurement. Further details of gradient heat-flux sensors "GHFS" can be found for example from the publication: "*Local Heat Flux Measurement in a Permanent Magnet Motor at No Load*", Hanne K. Jussila, Andrey V. Mityakov, Sergey Z. Sapozhnikov, Vladimir Y. Mityakov and Juha Pyrhonen, Institute of Electrical and Electronics Engineers "IEEE" Transactions on Industrial Electronics, Volume: 60, pp. 4852-4860, 2013.

In accordance with the invention, there is provided also a new method for managing electrical current of an electronic component. A method according to the invention comprises:

receiving an electrical control signal from a gradient heat-flux sensor based on thermoelectric anisotropy, the gradient heat-flux sensor conducting heat generated by the electronic component and generating the electrical control signal proportional to a heat-flux through the gradient heat-flux sensor and the gradient heat-flux sensor constituting at least a part of a heat conduction path from a heat generating portion of the electronic component to a heat-sink element, and managing the electrical current of the electronic component at least partly on the basis of the electrical control signal, wherein the electrical control signal is received from at least two side-by-side placed and series connected sensor elements of the gradient heat-flux sensor, disturbance voltages induced by a changing magnetic flux to the sensor elements being substantially same due to the side-by-side placing of the at least two sensor elements and the disturbance voltages cancelling each other at least partly due to the series connection of the at least two sensor elements.

A number of exemplifying and non-limiting embodiments of the invention are described in accompanied dependent claims.

Various exemplifying and non-limiting embodiments of the invention both as to constructions and to methods of operation, together with additional objects and advantages thereof, will be best understood from the following description of specific exemplifying and non-limiting embodiments when read in connection with the accompanying drawings.

The verbs "to comprise" and "to include" are used in this document as open limitations that neither exclude nor require the existence of unrecited features. The features recited in dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF THE FIGURES

Exemplifying and non-limiting embodiments of the invention and their advantages are explained in greater detail below in the sense of examples and with reference to the accompanying drawings, in which.

DESCRIPTION OF THE EXEMPLIFYING EMBODIMENTS

Figure 1A:
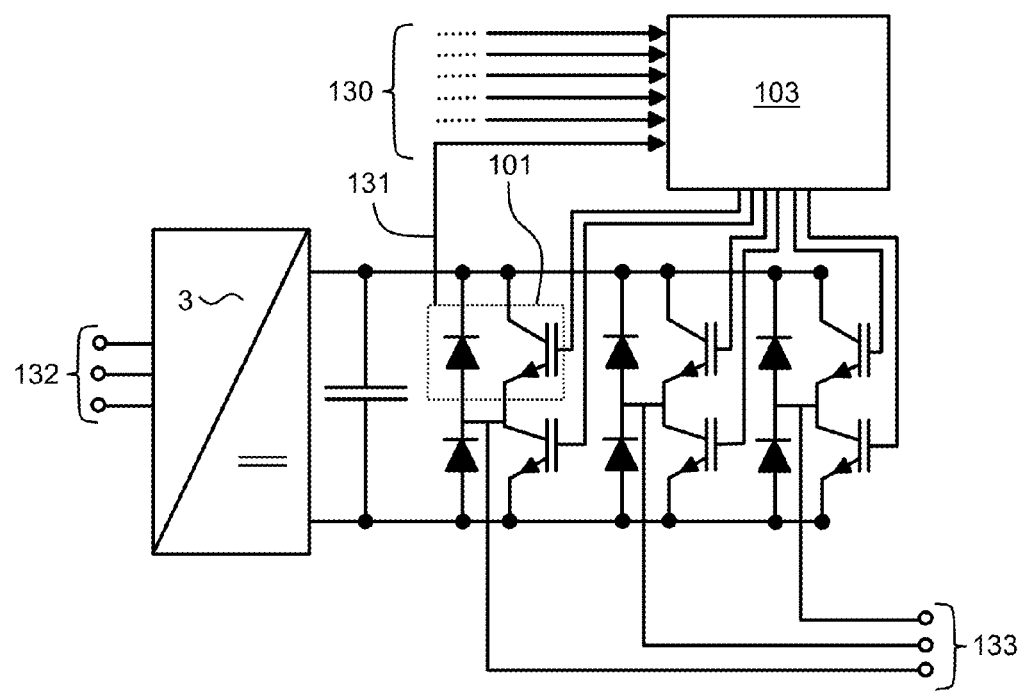
FIGS. 1*a*, 1*b* and 1*c* illustrate an electronic device according to an exemplifying and non-limiting embodiment of the invention.

FIGS. 1*a* illustrates an electronic device according to an exemplifying and non-limiting embodiment of the invention. In this exemplifying case, the electronic device is a frequency converter adapted to receive electrical energy from a three-phase network via terminals 132 and to supply three-phase alternating voltage via terminals 133. The electronic device comprises six electronic components each comprising a controllable power electronic switch and an antiparallel connected diode. In FIG. 1*a*, one of the electronic components is denoted with a reference number 101. In this exemplifying case, the controllable power electronic switches of the electronic components are insulated gate bipolar transistors "IGBT". In electronic devices according to such exemplifying and non-limiting embodiments of the invention that the electronic devices comprise one or more power electronic switches, each power electronic switch can be for example an IGBT, a bipolar junction transistor "BJT", a diode, a thyristor, a gate-turn-off thyristor "GTO", a metal-oxide-semiconductor field-effect transistor "MOSFET", an Integrated Gate-Commutated Thyristor "IGCT", or an Injection-Enhanced Gate Transistor "IEGT".

The electronic device comprises gradient heat-flux sensors "GHFS" which are adapted to conduct heat generated by the electronic components and to generate electrical control signals 130 which are linearly or non-linearly proportional to heat-fluxes through the gradient heat-flux sensors. In FIG. 1*a*, the electrical control signal generated by the gradient heat-flux sensor adapted to conduct the heat generated by the electronic component 101 is denoted with a reference number 131. The electronic device comprises a controller 103 responsive to the electrical control signals 130 and adapted to manage electrical currents of the electronic components at least partly on the basis of the electrical control signals. In addition to the electrical control signals 130, the controller 103 can be adapted to manage the electrical currents on the basis of one or more measured temperatures, measured values of the electrical currents, and/or other appropriate information.

Figure 1B:
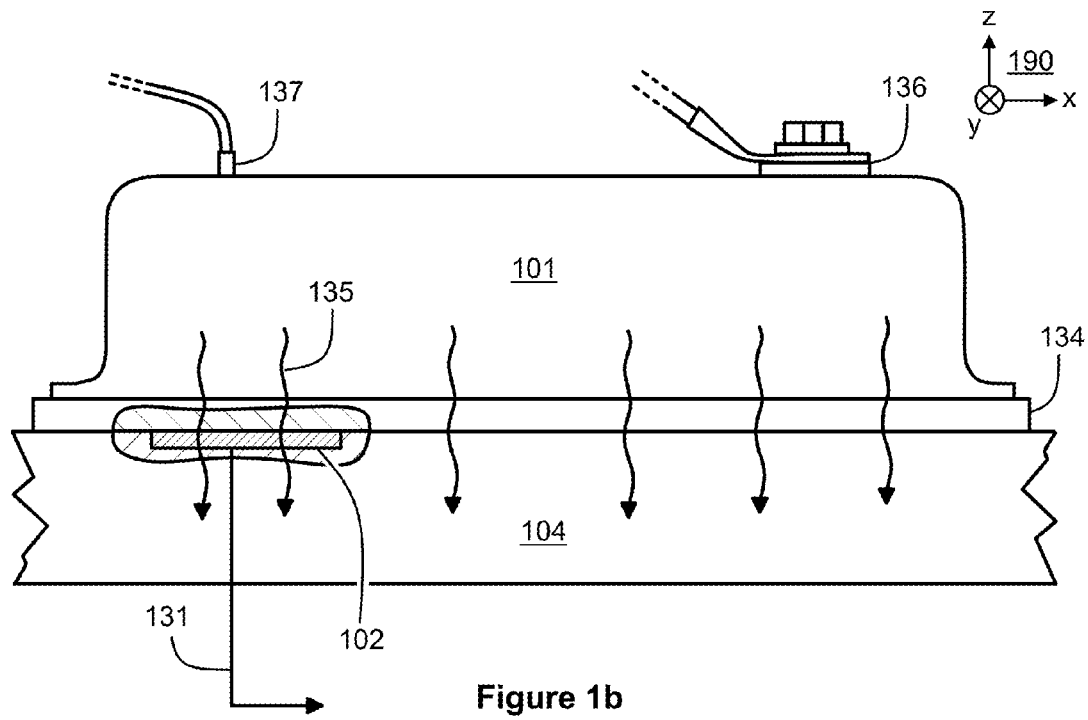

FIG. 1*b* shows a side view of the electronic component 101. The gradient heat-flux sensor is shown with the aid of a partial section view shown in FIG. 1*b*. The gradient heat-flux sensor is denoted in FIG. 1*b* with a reference number 102. In this exemplifying case, the gradient heat-flux sensor 102 constitutes a part of a heat conduction path from a heat generating portion of the electronic component 101 to a heat-sink element 104. The heat-sink element 104 may comprise cooling fins for conducting heat to the ambient air and/or cooling ducts for conducting cooling fluid, e.g. water. In this exemplifying case, the electronic component 101 comprises a baseplate 134 which is against the heat-sink element. The heat-sink element 104 comprises a cavity for the gradient heat-flux sensor 102 so that the gradient heat-flux sensor is against the baseplate 134 of the electronic component 101. In FIG. 1b, the heat flow from the electronic component 101 to a heat-sink element 104 is depicted with wavy arrows one of which is denoted with a reference number 135. In FIG. 1b, one of the main current terminals of the electronic component 101 is denoted with a reference number 136 and a control terminal, i.e. a gate connection of the IGBT, is denoted with a reference number 137.

In the exemplifying electronic device illustrated in FIGS. 1a and 1b, the gradient heat-flux sensors are located on surfaces of the electronic components, i.e. against the baseplates of the electronic components. This is however not the only possible choice. It is also possible that a gradient heat-flux sensor is embedded to e.g. the base plate of an electrical component or to another place of the casing of the electrical component. It is also possible that a gradient heat-flux sensor is an integrated element of an electrical component for example so that the gradient heat-flux sensor is inside the casing of the electrical component. In cases where an electrical component is a module type component which comprises e.g. many semiconductor units such as e.g. IGBTs, the module type component may comprise many gradient heat-flux sensors so that each semiconductor unit is provided with one of the gradient heat-flux sensors. Thus, it is possible to monitor the thermal behavior of the module type component in a semiconductor unit specific manner.

It is to be noted that the invention is not limited to any particular ways to arrange a gradient heat-flux sensor to conduct heat generated by an electronic component.

In an electronic device according to an exemplifying and non-limiting embodiment of the invention, the controller 103 is adapted to reduce the switching frequency of the electronic components in response to a situation in which the electrical control signals 130 are indicative of heat-fluxes exceeding a first safety limit. Reducing the switching frequency is actually managing high frequency components of the electrical currents. Thus, the reducing the switching frequency can be deemed to represent a way to manage the electrical currents of the electronic components.

In an electronic device according to an exemplifying and non-limiting embodiment of the invention, the controller 103 is adapted to activate short-circuit protection of the electronic components in response to a situation in which the electrical control signals 130 are indicative of heat-fluxes exceeding a second safety limit. The second safety limit is advantageously higher than the above-mentioned first safety limit used for controlling the switching frequency. The short-circuit protection may comprise for example controlling one or more of the electronic components to a non-conducting state and/or otherwise switching off one or more of the currents of the electronic components.

Figure 1C:
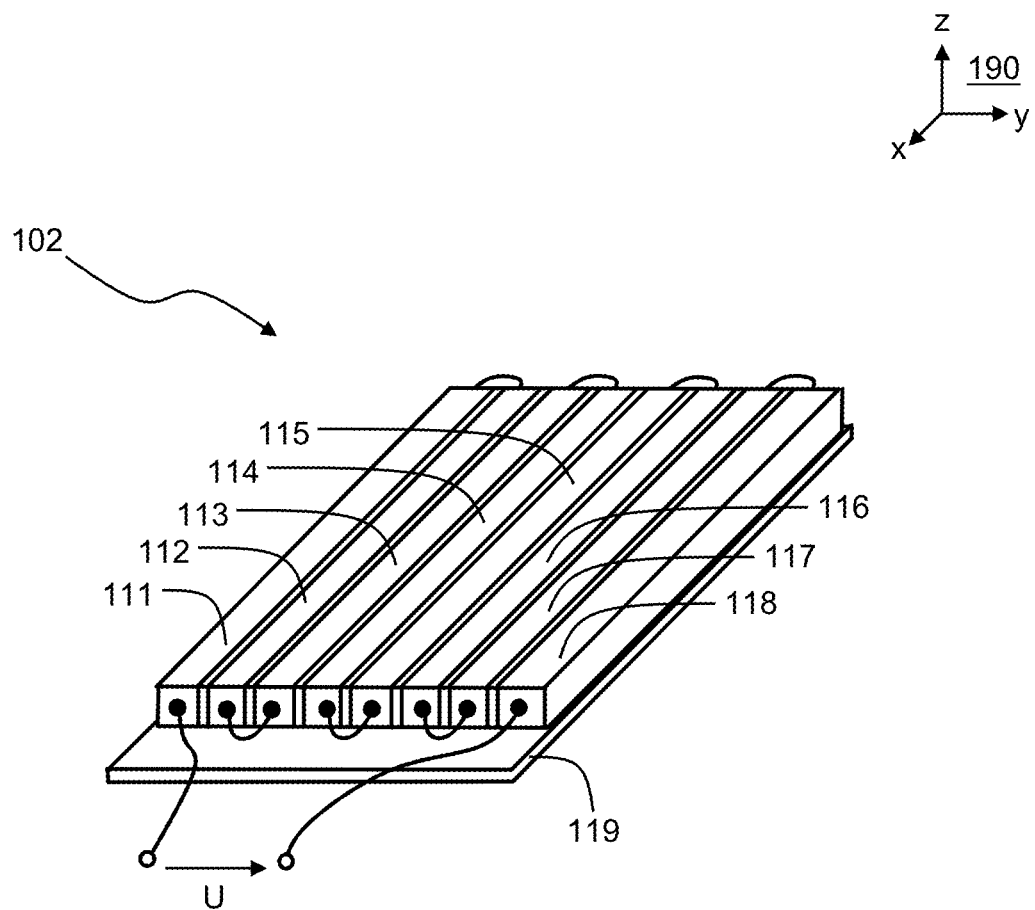

FIG. 1c shows a perspective view of the gradient heat-flux sensor 102. The viewing directions related to FIGS. 1b and 1c are illustrated with the aid of a coordinate system 190 shown in FIGS. 1b and 1c. The gradient heat-flux sensor 102 comprises sensor elements 111, 112, 113, 114, 115, 116, 117, and 118 electrically connected in series so that disturbance voltages induced by a changing magnetic flux to the sensor elements 111-118 are adapted to cancel each other at least partly. The voltage U shown in FIG. 1c represents the electrical control signal generated by the gradient heat-flux sensor 102. Advantageously, the gradient heat-flux sensor comprises strips of electrically insulating material between adjacent ones of the sensor elements 111-118. Furthermore, the gradient heat-flux sensor 102 may comprise an insulator plate 119 that can be made of material which is electrically insulating but which has sufficient heat conductivity. The insulator plate 119 can be made of for example mica. Depending on the operating environment of the gradient heat-flux sensor 102, there can be a similar other insulator plate on the other sides of the sensor elements 111-118. The other insulator plate is not shown in FIG. 1c.

In an electronic device according to an exemplifying and non-limiting embodiment of the invention, each of the sensor elements 111-118 comprises anisotropic material for generating a part of the voltage U which is proportional to a first temperature gradient component transverse to a second temperature gradient component parallel with the heat-flux through the gradient heat-flux sensor. In this case, the first temperature gradient component is parallel with the x-axis of the coordinate system 190 and the second temperature gradient component is parallel with the z-axis of the coordinate system 190. The anisotropic material can be for example bismuth, and each of the sensor elements 111-118 can be a single crystal of bismuth.

In an electronic device according to an exemplifying and non-limiting embodiment of the invention, each of the sensor elements 111-118 comprises a multilayer structure for generating a part of the voltage U. The layers of the multilayer structure are oblique with respect to the surface of the gradient heat-flux sensor for receiving the heat-flux from the electronic component. The multilayer structure may comprise first layers and second layers so that the second layers are interleaved with the first layers. The second layers can be made of for example semiconductor material, and the first layers can be made of for example metal or metal alloy or of semiconductor material different from the semiconductor material of the first layers.

It is to be noted that the above-described gradient heat-flux sensors are merely examples and that the invention in not limited to any particular materials and/or structures and/or manufacturing methods of gradient heat-flux sensors.

Figure 2A:
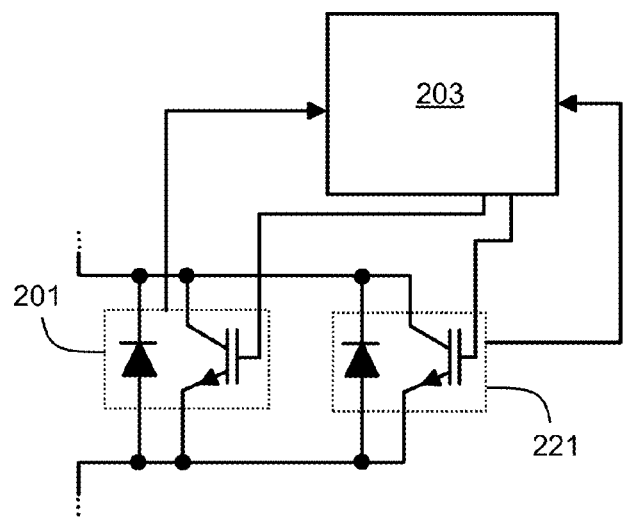
FIGS. 2*a*, 2*b* and 2*c* illustrate a part of an electronic device according to an exemplifying and non-limiting embodiment of the invention.

FIG. 2a illustrates a part of an electronic device according to an exemplifying and non-limiting embodiment of the invention. In this exemplifying case, the electronic device comprises two parallel connected electronic components 201 and 221. Each of the electronic components comprises a controllable power electronic switch and an antiparallel connected diode. In this exemplifying case, the controllable power electronic switch is an insulated gate bipolar transistor "IGBT". The electronic device comprises gradient heat-flux sensors "GHFS" adapted to conduct heat generated by the electronic components and to generate electrical control signals proportional to heat-fluxes through the gradient heat-flux sensors. The electronic device comprises a controller 203 responsive to the electrical control signals and adapted to manage electrical currents of the electronic components at least partly on the basis of the electrical control signals. The controller 203 is adapted to control the operation of the parallel connected electronic components 201 and 221 at least partly on the basis of the electrical control signals so as to balance electrical currents of the parallel connected electronic components. Furthermore, the controller can be adapted to control the switching frequency of the electronic components 201 and 221 and/or to control the short circuit "SC" protection on the basis of the electrical control signals generated by the gradient heat-flux sensors.

In addition to the above-mentioned electrical control signals, the controller 203 can be adapted to manage the electrical currents of the electronic components 201 and 221 on the basis of one or more measured temperatures, measured values of the electrical currents, and/or other appropriate information.

Figure 2B:
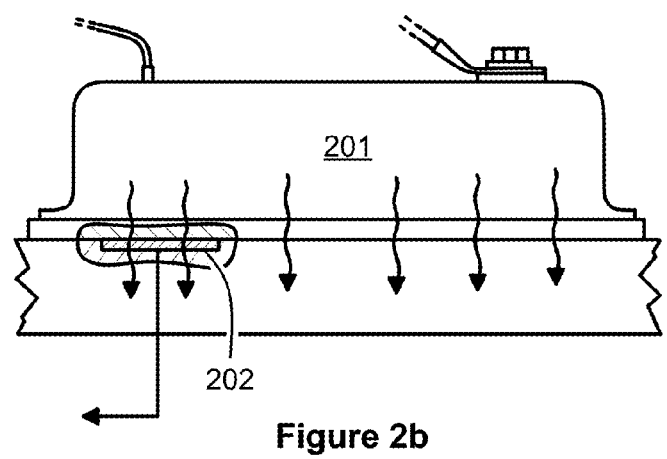
Figure 2C:
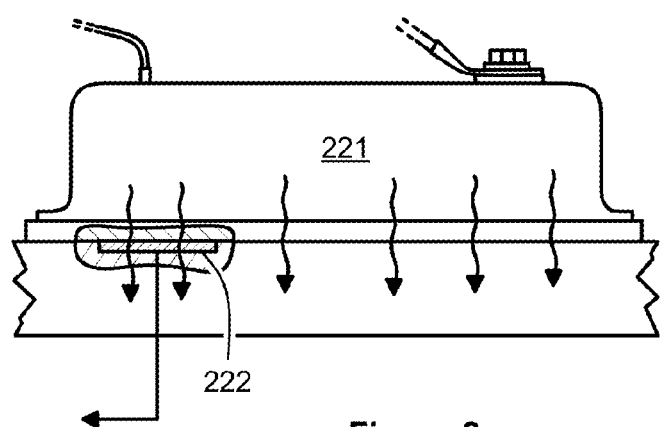

FIGS. 2b and 2c show side views of the electronic components 201 and 221. The gradient heat-flux sensors are shown with the aid of partial section views shown in FIGS. 2b and 2c. The gradient heat-flux sensors are denoted in FIGS. 2b and 2c with reference numbers 202 and 222.

Figure 3:
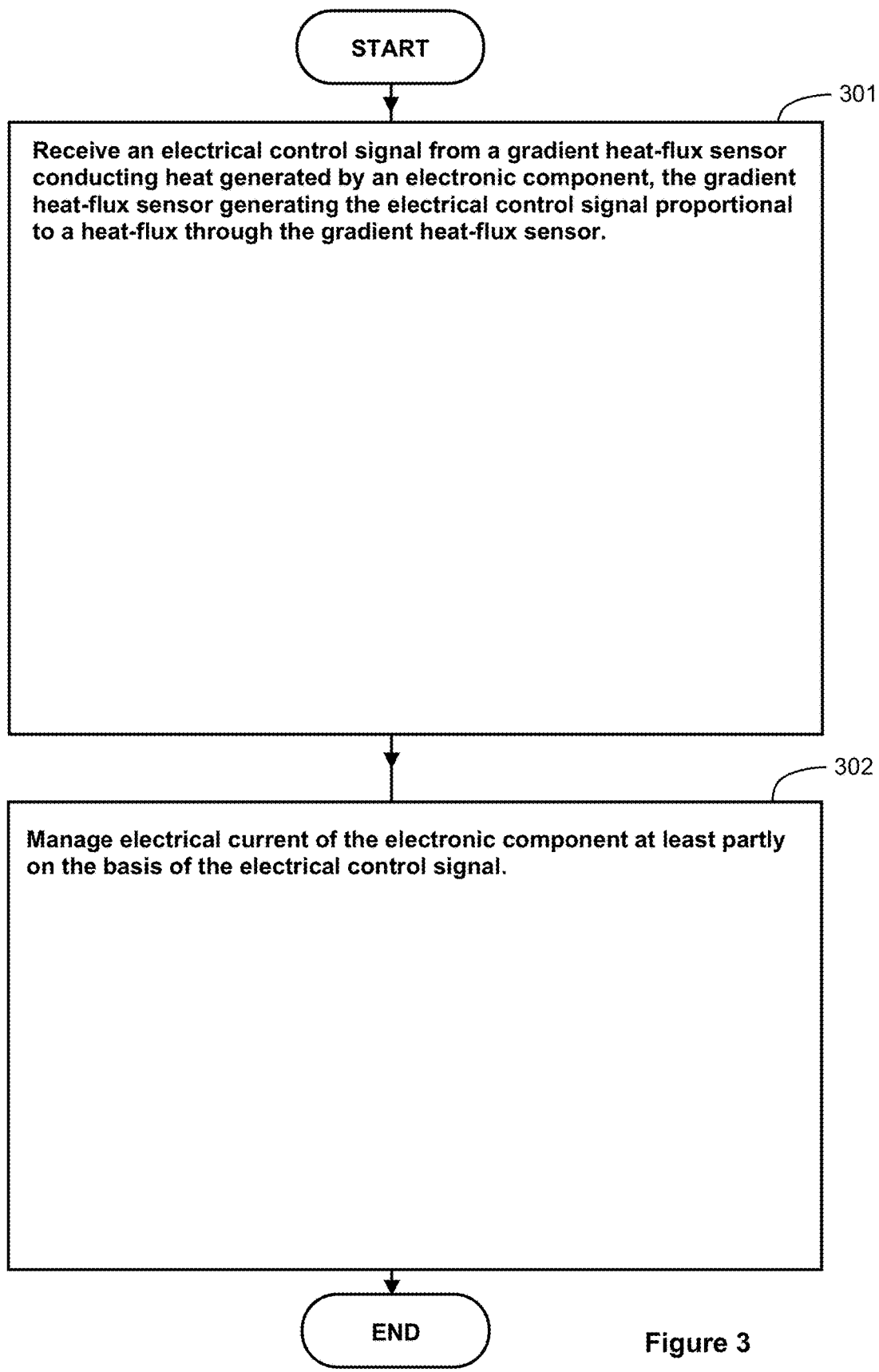
FIG. 3 shows a flowchart of a method according to an exemplifying and non-limiting embodiment of the invention for managing electrical current of an electronic component.

FIG. 3 shows a flowchart of a method according to an exemplifying and non-limiting embodiment of the invention for managing electrical current of an electronic component. The method comprises the following actions:

action 301: receiving an electrical control signal from a gradient heat-flux sensor "GHFS" based on thermoelectric anisotropy and conducting heat generated by the electronic component, the gradient heat-flux sensor generating the electrical control signal proportional to a heat-flux through the gradient heat-flux sensor, and action 302: managing the electrical current of the electronic component at least partly on the basis of the electrical control signal.

In a method according to an exemplifying and non-limiting embodiment of the invention, the electrical control signal is received from at least two series connected sensor elements of the gradient heat-flux sensor, where disturbance voltages induced by a changing magnetic flux to the sensor elements cancel each other at least partly in the series connection of the at least two sensor elements.

A method according to an exemplifying and non-limiting embodiment of the invention comprises reducing switching frequency of the electronic component in response to a situation in which the electrical control signal is indicative of a heat-flux exceeding a first safety limit.

A method according to an exemplifying and non-limiting embodiment of the invention comprises activating short-circuit protection of the electronic component in response to a situation in which the electrical control signal is indicative of a heat-flux exceeding a second safety limit.

A method according to an exemplifying and non-limiting embodiment of the invention comprises balancing the electrical current of the electronic component with electrical current of another electronic component on the basis of the electrical control signal and another electrical control signal received from another gradient heat-flux sensor conducting heat generated by the other electronic component and generating the other electrical control signal proportional to a heat-flux through the other gradient heat-flux sensor.

The specific examples provided in the description given above should not be construed as limiting the applicability and/or interpretation of the appended claims. It is to be noted that lists and groups of examples given in this document are non-exhaustive lists and groups unless otherwise explicitly stated.

What is claimed is:

1. An electronic device comprising:
   at least one electronic component,
   a heat-sink element,
   a gradient heat-flux sensor based on thermoelectric anisotropy and adapted to conduct heat generated by the electronic component and to generate an electrical control signal proportional to a heat-flux through the gradient heat-flux sensor, and
   a controller responsive to the electrical control signal and adapted to manage electrical current of the electronic component at least partly on the basis of the electrical control signal,
   wherein the gradient heat-flux sensor (102) constitutes at least a part of a heat conduction path from a heat generating portion of the electronic component to the heat-sink element, and
   wherein the gradient heat-flux sensor comprises at least two sensor elements placed side by side so as to achieve a situation in which disturbance voltages induced by a changing magnetic flux to the sensor elements are substantially same and electrically connected in series so that the disturbance voltages induced by the changing magnetic flux to the sensor elements are adapted to cancel each other at least partly.

2. An electronic device according to claim 1, wherein the controller is adapted to reduce switching frequency of the electronic component in response to a situation in which the electrical control signal is indicative of a heat-flux exceeding a first safety limit.

3. An electronic device according to claim 1, wherein the controller is adapted to activate short-circuit protection of the electronic component in response to a situation in which the electrical control signal is indicative of a heat-flux exceeding a second safety limit.

4. An electronic device according to claim 1, wherein the electronic device comprises another electronic component and another gradient heat-flux sensor adapted to conduct heat generated by the other electronic component and to produce another electrical control signal proportional to a heat-flux through the other gradient heat-flux sensor, and wherein the electronic components are parallel connected and the controller is adapted to control operation of the parallel connected electronic components at least partly on the basis of the electrical control signals so as to balance electrical currents of the parallel connected electronic components.

5. An electronic device according to claim 1, wherein the gradient heat-flux sensor comprises anisotropic material for generating the electrical control signal proportional to a first temperature gradient component transverse to a second temperature gradient component parallel with the heat-flux through the gradient heat-flux sensor.

6. An electronic device according to claim 5, wherein the anisotropic material is bismuth.

7. An electronic device according to claim 1, wherein the gradient heat-flux sensor comprises a multilayer structure for generating the electrical control signal proportional to a first temperature gradient component transverse to a second temperature gradient component parallel with the heat-flux through the gradient heat-flux sensor, layers of the multilayer structure being oblique with respect to a surface of the gradient heat-flux sensor for receiving the heat-flux.

8. An electronic device according to claim 7, wherein the multilayer structure comprises first layers and second layers, the second layers being made of semiconductor material and being interleaved with the first layers and the first layers being made of metal, metal alloy, or semiconductor material.

9. An electronic device according to claim 1, wherein the electronic component comprises at least one of the following: a bipolar junction transistor "BJT", a diode, an insulated gate bipolar transistor "IGBT", a thyristor, a gate-turn-off thyristor "GTO", a metal-oxide-semiconductor field-effect transistor "MOSFET", Integrated Gate-Commutated Thyristor "IGCT", Injection-Enhanced Gate Transistor "IEGT".

10. A method comprising:
receiving (301) an electrical control signal from a gradient heat-flux sensor based on thermoelectric anisotropy and conducting heat generated by an electronic component, the gradient heat-flux sensor generating the electrical control signal proportional to a heat-flux through the gradient heat-flux sensor and the gradient heat-flux sensor constituting at least a part of a heat conduction path from a heat generating portion of the electronic component to a heat-sink element, and
managing (302) electrical current of the electronic component at least partly on the basis of the electrical control signal,
wherein the electrical control signal is received from at least two side-by-side placed and series connected sensor elements of the gradient heat-flux sensor, disturbance voltages induced by a changing magnetic flux to the sensor elements being substantially same due to the side-by-side placing of the at least two sensor elements and the disturbance voltages cancelling each other at least partly due to the series connection of the at least two sensor elements.

11. A method according to claim 10, wherein the method comprises reducing switching frequency of the electronic component in response to a situation in which the electrical control signal is indicative of a heat-flux exceeding a first safety limit.

12. A method according to claim 10, wherein the method comprises activating short-circuit protection of the electronic component in response to a situation in which the electrical control signal is indicative of a heat-flux exceeding a second safety limit.

13. A method according to claim 10, wherein the method comprises balancing the electrical current of the electronic component with electrical current of another electronic component on the basis of the electrical control signal and another electrical control signal received from another gradient heat-flux sensor conducting heat generated by the other electronic component and generating the other electrical control signal proportional to a heat-flux through the other gradient heat-flux sensor.

* * * * *